United States Patent [19]

Barr

[11] 4,311,960
[45] Jan. 19, 1982

[54] TRANSIENT SIGNAL PROCESSING CIRCUIT

[75] Inventor: Frank P. Barr, Albuquerque, N. Mex.

[73] Assignee: Rockwell International Corporation, El Segundo, Calif.

[21] Appl. No.: 106,300

[22] Filed: Dec. 21, 1979

[51] Int. Cl.³ .................. G01R 19/04; H03K 5/153
[52] U.S. Cl. .................. 324/103 P; 307/351; 324/102; 324/113; 346/59
[58] Field of Search .................. 324/103 P, 102, 113, 324/112; 346/59; 307/351

[56] References Cited

U.S. PATENT DOCUMENTS

| 2,950,159 | 8/1960 | McCulley et al. | 346/59 |
| 3,662,380 | 5/1972 | Cargile | 324/112 |
| 4,223,180 | 9/1980 | Eckels | 324/103 P |

Primary Examiner—Ernest F. Karlsen
Attorney, Agent, or Firm—H. Fredrick Hamann; Craig O. Malin; John J. Deinken

[57] ABSTRACT

A transient signal processing circuit is disclosed which includes a signal input, an adjustable threshold detector for selecting from the signal input a signal portion having at least a minimum amplitude, a peak value detector connected to the threshold detector for providing an output when the signal portion reaches a maximum amplitude, a monostable multivibrator connected to the peak value detector to introduce a time delay and thereby allow the output to stabilize, a sample and hold circuit connected to the multivibrator to record the value of the maximum amplitude, and a clock connected to the multivibrator to indicate the time at which the maximum amplitude was attained.

5 Claims, 2 Drawing Figures

TRANSIENT SIGNAL PROCESSING CIRCUIT

STATEMENT OF GOVERNMENT INTEREST

The invention herein described was made in the course of or under a contract, or subcontract thereunder, with the United States Army.

BACKGROUND OF THE INVENTION

This invention is related to electronic circuitry and, more particularly, to circuitry for detecting and analyzing a transient signal.

Many areas of experimentation and testing which employ electronic equipment utilize signal processing circuitry which is adapted to operate on data in the form of electrical signals and to extract various forms of information about that data. Moreover, in such applications, it is frequently desirable to convert such data to a digital form in order to facilitate the use of digital computation techniques for processing the data, thereby permitting enhanced accuracy and analysis and a greater amount of processing than would otherwise be possible.

The digitization of a transient signal using a sample and hold circuit and an analog to digital converter is known in the signal processing art. In conventional techniques of this sort, the sample and hold device retains the peak value of the signal, which is then supplied to the analog to digital converter. In this prior art circuitry, however, no time reference is made available to determine when the peak value occurred.

Therefore, it would be advantageous to provide signal processing circuitry capable of detecting not only the peak value but also the time of occurrence of a transient signal. It would further be desirable to provide such circuitry which is capable of rendering this signal acquisition process as fully automatic as possible.

SUMMARY OF THE INVENTION

It is a general object of this invention to provide an improved transient signal processing circuit.

A transient signal processing circuit, according to this invention, includes a signal input, a threshold detector for selecting from the signal input, a signal portion having at least a minimum amplitude, a peak value detector connected to the threshold detector for providing an output when the signal portion reaches a maximum amplitude, a sample and hold circuit for receiving the output and recording the value of the maximum amplitude, and a clock for receiving the output to indicate the time at which the maximum amplitude was attained.

In a more particular embodiment, the circuit further includes a monostable multivibrator connected to the peak value detector to provide the output to the sample and hold circuit and to the clock, the multivibrator being adapted to introduce a time delay to allow the value of the maximum amplitude to stabilize before it is recorded by the sample and hold circuit.

The circuit may also include a digitization signal output from the multivibrator for connection to an analog to digital converter to initiate the conversion of the maximum amplitude value and the time of the maximum value to digital quantities for further analysis by a digital computer.

In another more particular embodiment, the threshold detector may be adjusted to vary the value of the maximum amplitude and the circuit further includes a digital to analog converter coupled to the threshold detector to facilitate the adjustment of the minimum amplitude by a digital computer.

These examples of the more important features of the invention have been broadly outlined here in order to facilitate an understanding of the detailed description that follows and so that the contributions which this invention provides to the art may be better appreciated. There are, of course, additional features of the invention, which will be described below and which are included in the subject matter of the appended claims.

BRIEF DESCRIPTION OF THE DRAWINGS

Additional objects, features, and advantages of the present invention will become apparent by referring to the detailed description below of the preferred embodiments in connection with the accompanying drawings, wherein like reference numerals refer to like elements throughout all the figures. In the drawings.

DESCRIPTION OF THE PREFERRED EMBODIMENT

Figure 1:
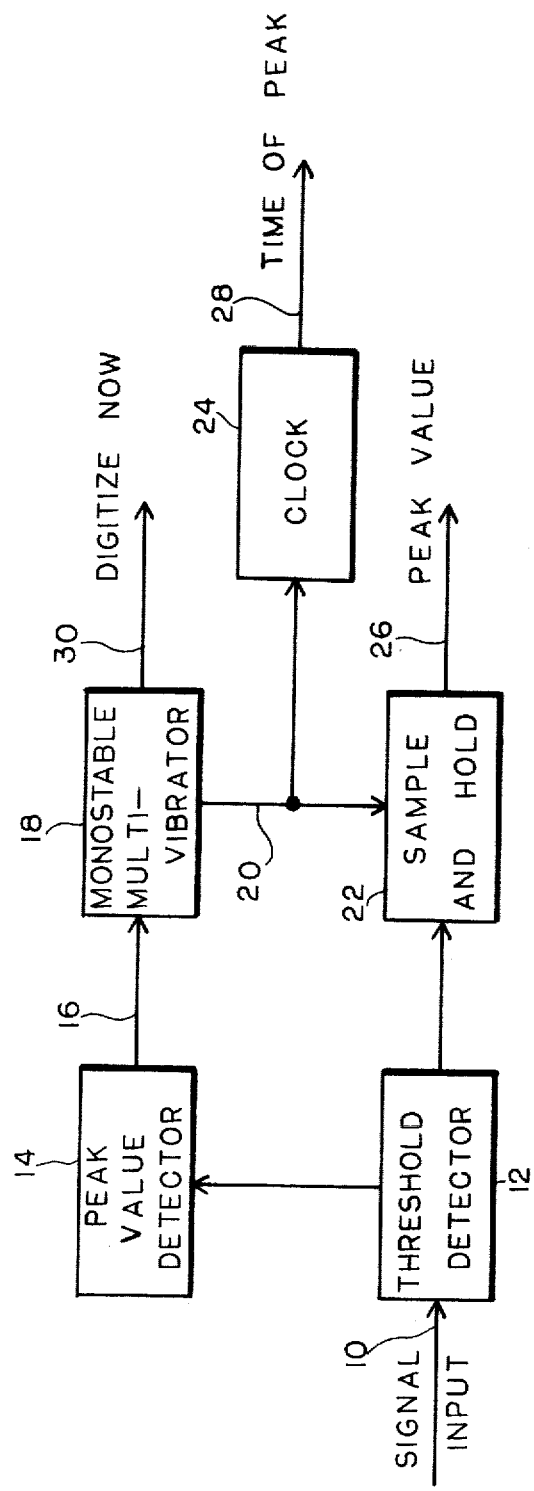
FIG. 1 is a block diagram of a transient signal processing circuit constructed according to the present invention.

Now referring to FIG. 1, illustrated in block diagram form is a transient signal processing circuit configured according to the present invention. A signal to be processed is introduced into the circuit at the signal input 10. The input 10 is applied to a threshold detector 12, where a signal portion having at least a minimum amplitude is selected from the signal input.

The signal portion selected by the detector 12 is then applied to a peak value detector 14, which provides an output 16 at that point in time when the selected signal portion reaches a maximum amplitude. A monostable multivibrator 18 receives the output 16 and introduces a time delay in the signal processing sequence to allow the output to reach a stabilized value.

After the signal has stabilized, the stabilized signal 20 is applied to a sample and hold circuit 22 and a clock 24. The sample and hold circuit measures the amplitude of the signal 20 and provides a peak value output 26 indicative of the maximum amplitude which was present in the signal input 10.

The clock 24 receives the signal 20 and provides the time of peak output 28 which determines the time at which the peak value in the input 10 occurred. A "digitize now" signal 30 may also be obtained from the multivibrator 18 to facilitate the use of digital equipment in processing the peak value and time of peak outputs. The signal 30 may be connected to an analog to digital converter to initiate the conversion of the outputs 26 and 28 to digital signals, which may then be input to a digital computer for further processing.

Figure 2:
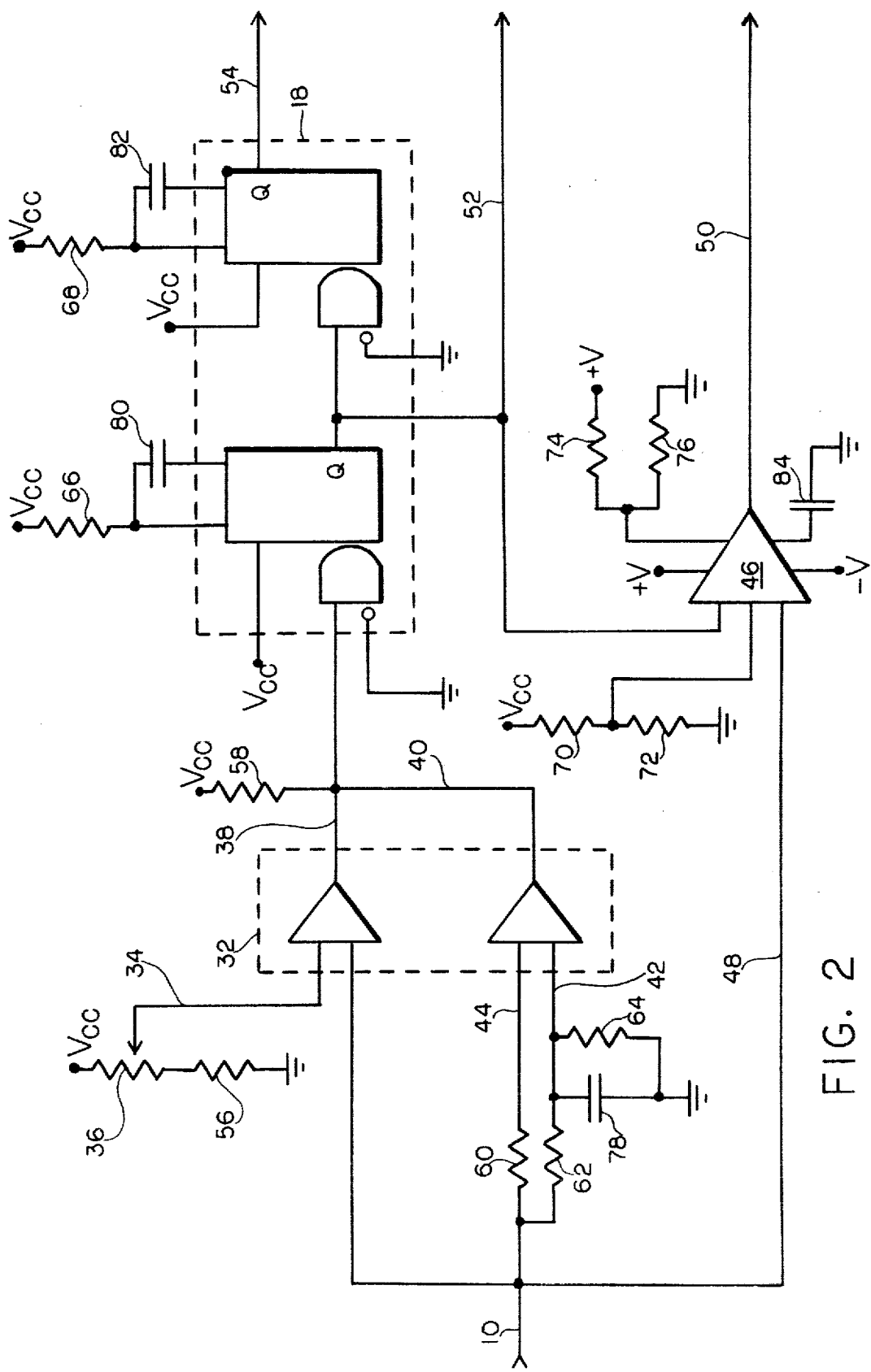
FIG. 2 is an electrical schematic diagram illustrating one preferred embodiment of the circuit constructed according to the present invention.

Although a large number of different applications for the circuit of this invention may doubtless be envisioned by those skilled in the art, the inventor has developed a particular embodiment of the invention for employment to the field of nondestructive testing, where the circuit is used to analyze transient AC signals generated by an electromagnetic acoustic transducer (EMAT) in response to ultrasonic waves traveling in an electrically conductive material. In FIG. 2, one preferred embodiment of the circuit of this invention is illustrated in schematic form as it is used in the nondestructive testing application. In this embodiment, the signal input 10 is applied to a voltage comparator 32. The sequence of operation of the circuit is inhibited by the comparator until the applied signal amplitude exceeds the preset threshold value applied through line 34, which is determined by the setting of a potentiometer 36. When the threshold value is exceeded, an output 38 of the comparator goes "high", which will then allow any high signal on line 40 from the comparator to be applied to a monostable multivibrator 18.

The voltage comparator 32 is also utilized to detect the point in time when the peak value of the input signal occurs. A resistor - capacitor network, consisting of resistors 60, 62, and 64 and capacitor 78, introduces a hysteresis into the signal input 10, thereby allowing the signal on line 42 to lag that on line 44. This hysteresis condition will persist as long as the input signal is increasing in voltage. When the signal begins to decrease in amplitude, however, the voltage on line 42 will exceed that on line 44 and the output 40 of the comparator will go "high". The presence of this "high" signal and the "high" signal from the output 38 will trigger the multivibrator 18.

Triggering the multivibrator causes a sample and hold circuit element 46 to retain the present voltage value then applied from the signal input via line 48. This value, which provides the peak value signal on output 50, represents the voltage of the incoming signal which is present at the time the change in voltage with time turns negative. By also applying the output of the multivibrator to a system clock circuit, via line 52, a time output is available to indicate when the peak value occurred. In addition, the multivibrator generates a "digitize now" signal on a line 54 to initiate an analog to digital conversion of the clock and peak value outputs. The time delays introduced by the multivibrator 18 allow the output 50 of the sample and hold element 46 to stabilize.

The particular embodiment illustrated in FIG. 2 utilizes the component values and types identified in Table 1.

TABLE I

| COMPONENT | MODEL NUMBER |
|---|---|
| Voltage Comparator 32 | LM 339 |
| Monostable Multivibrator 18 | 74221 |
| Sample and Hold 46 | LF 398 |
| VOLTAGE | VALUE |
| $V_{cc}$ | +5 VDC |
| +V | +12–15 VDC |
| −V | −12–15 VDC |
| RESISTOR | VALUE ($\Omega$) |
| 56 | 250 |
| 58 | 1K |
| 60 | 200 |
| 62 | 100 |
| 64 | 100 |
| 66 | 20K |
| 68 | 2K |
| 70 | 24K |
| 72 | 5.6K |
| 74 | 1K |
| 76 | 24K |
| CAPACITOR | VALUE ($\mu f$) |
| 78 | .01 |
| 80 | .0068 |
| 82 | .01 |
| 84 | .01 |

In conclusion, although typical embodiments of the present invention have been illustrated and discussed above, numerous modifications and alternative embodiments of the apparatus and method of this invention will be apparent to those skilled in the art in view of this description. For example, although the potentiometer 36 is shown as the threshold adjustment for the comparator 32, as mentioned earlier, the circuit can readily be automated by substituting a digital to analog converter and utilizing a digital processing means to select the desired threshold value. Accordingly, this description is to be considered as illustrative only and is provided for the purpose of teaching those skilled in art the manner of constructing the apparatus and performing the method of this invention. Furthermore, is should be understood that the forms of the invention depicted and described herein are to be considered as the presently preferred embodiments. Various changes may be made in the configurations, sizes, and arrangements of the components of the invention, as will be recognized by those skilled in the art, without departing from the scope of the invention. Equivalent elements, for example, might be substituted for those illustrated and described herein, parts or connections might be reversed or otherwise interchanged, and certain features of the invention might be utilized independently of the use of other features, all as will be apparent to one skilled in the art after receiving the benefit attained through reading the above description of the invention.

What is claimed is:

1. A transient signal processing circuit for analyzing a signal input, comprising:
   a threshold detector for selecting from said signal input a signal portion having at least a minimum amplitude;
   a peak value detector connected to said threshold detector for providing an output when said signal portion reaches a maximum amplitude;
   a sample and hold circuit for holding the value of said signal input upon receiving said output and thereby recording the value of said maximum amplitude; and
   a clock for receiving said output to indicate the time at which said maximum amplitude was attained.

2. The circuit of claim 1, further comprising:
   a monostable multivibrator connected to said peak value detector and providing said output to said sample and hold circuit and to said clock, said multivibrator being adapted to introduce a time delay to allow the value of said maximum amplitude to stabilize before it is recorded by said sample and hold circuit.

3. The circuit of claim 2, further comprising a digitization signal output from said multivibrator for connection to an analog to digital converter to initiate the conversion of said maximum amplitude value and the time of said maximum value to digital quantities for further analysis by a digital computer.

4. The circuit of claim 1, wherein said threshold detector may be adjusted to vary the value of said minimum amplitude.

5. A transient signal processing circuit for analyzing a signal input, comprising:
   an adjustable threshold detector for selecting from said signal input a signal portion having at least a minimum amplitude;

a peak value detector connected to said threshold detector for providing an output when said signal portion reaches a maximum amplitude;

a monostable multivibrator connected to said peak value detector to introduce a time delay and thereby allow said maximum amplitude to stabilize;

a sample and hold circuit connected to said multivibrator to hold the value of said signal input upon receiving said stabilized output and thereby record the value of said maximum amplitude; and a clock connected to said multivibrator to indicate the time at which said maximum amplitude was attained.

* * * * *